US006866891B2

(12) United States Patent
Liebau et al.

(10) Patent No.: US 6,866,891 B2
(45) Date of Patent: Mar. 15, 2005

(54) TARGETED DEPOSITION OF NANOTUBES

(75) Inventors: Maik Liebau, Munich (DE); Eugen Unger, Augsburg (DE); Georg Dusberg, Munich (DE)

(73) Assignee: Infineon Technologies AG, Munich (DE)

( * ) Notice: Subject to any disclaimer, the term of this patent is extended or adjusted under 35 U.S.C. 154(b) by 87 days.

(21) Appl. No.: 10/413,505

(22) Filed: Apr. 14, 2003

(65) Prior Publication Data

US 2003/0228467 A1 Dec. 11, 2003

(30) Foreign Application Priority Data

Apr. 18, 2002 (DE) ......................................... 102 17 362

(51) Int. Cl.[7] ................................................. B05D 5/00
(52) U.S. Cl. ....................... 427/282; 427/288; 427/598; 427/372.2
(58) Field of Search ................................. 427/282, 288, 427/598, 372.2; 423/445 R, 447.1, 447.2

(56) References Cited

U.S. PATENT DOCUMENTS

| | | | | |
|---|---|---|---|---|
| 6,555,945 B1 | * | 4/2003 | Baughman et al. | 310/300 |
| 6,659,598 B2 | * | 12/2003 | Grimes et al. | 347/77 |
| 6,682,677 B2 | * | 1/2004 | Lobovsky et al. | 264/172.11 |
| 6,712,864 B2 | * | 3/2004 | Horiuchi et al. | 23/314 |
| 6,723,279 B1 | * | 4/2004 | Withers et al. | 419/27 |
| 6,753,108 B1 | * | 6/2004 | Hampden-Smith et al. | 429/44 |
| 2002/0125470 A1 | | 9/2002 | Hoenlein et al. | |

FOREIGN PATENT DOCUMENTS

DE             100 38 124 A1    2/2002

OTHER PUBLICATIONS

M. Fujiwara, et al., "Magnetic Orientation and Magnetic Properties of a Single Carbon Nanotube," J. Phys. Chem., vol. 105, No. 18, pp. 1–4 (May 10, 2001).

A. Bachtold, et al., "Logic Circuits with Carbon Nanotube Transistors," vol. 294, pp. 1317–1320 (Nov. 9, 2001).

Xia et al., "Softlithographie," Angewandte Chemie (Applied Chemistry), vol. 110,, pp. 569–594 (1998).

* cited by examiner

*Primary Examiner*—Bret Chen
(74) *Attorney, Agent, or Firm*—Fish & Richardson P.C.

(57) ABSTRACT

A method for targeted deposition of a nanotube on a planar surface includes providing a ram made from elastomeric material and having a relief structure on its surface. A microfluid capillary system, with an inlet and an outlet, is then formed by applying the ram to a planar substrate. A dispersion of nanotubes is brought into contact with the inlet, thereby enabling capillary force to disperse the nanotubes. through the microfluid capillary system. The resulting dispersion of nanotubes is then dried and the ram removed.

15 Claims, 1 Drawing Sheet

TARGETED DEPOSITION OF NANOTUBES

FIELD OF INVENTION

The present invention relates to a method for the targeted deposition of nanotubes, in particular carbon nanotubes, on planar surfaces by exploiting capillary forces using microfluid capillary systems.

RELATED APPLICATIONS

This application claims the benefit of the Apr. 18, 2002 priority date of German application DE 102 17 362.1, the contents of which are herein incorporated by reference.

BACKGROUND

Since nanotubes, in particular carbon nanotubes, are suitable for use as metallic conductors and as semiconductors, in the context of nanocircuitry it is desirable for nanotubes of this type to be applied in targeted structured form to planar substrates. The use of nanotubes, such as in particular carbon nanotubes, as components, e.g. in electric circuits, requires them to make contact with metallic conductors. Nanotubes of this type are usually available as dispersions or as powders. When dispersions of this type are applied to planar surfaces, however, random distributions of bundles of nanotubes and of isolated nanotubes are usually obtained. Therefore, nanotubes from dispersions are applied to surfaces which have already been prestructured. Alternatively, the surfaces are suitably structured after the nanotubes have been deposited, i.e. electric conductors and pads are then arranged on the substrate surface. Furthermore, it is also possible for nanotubes to be deposited on a substrate in a random orientation and to be located and selected using high-resolution methods, such as force microscopy, and then for the appropriately positioned nanotube(s) to be provided with suitable contacts, such as for example gold contacts, in a targeted manner. It has already been possible to produce logic circuits based on carbon nanotubes on this basis (cf. A. Bachthold et al., Science 294, pages 1317–1320 (2001)).

However, the prior art does not currently provide an efficient method which allows targeted application of nanotubes to planar substrates in defined structures, in particular in the nanometer range.

SUMMARY

The present invention is therefore based on the object of providing a method which is intended to allow targeted application of dispersions of nanotubes of this type to planar surfaces, i.e. to allow nanotubes of this type to be arranged in defined, predetermined geometric structures, in order, in this way, by way of example, also to enable nanotubes to be used effectively as electric lines in the circuits of microchips.

In particular, the invention provides a method for the targeted deposition of nanotubes on planar surfaces, comprising the steps of:

(a) providing a ram made from elastomeric material having a relief structure on one of the ram surfaces,
(b) applying the ram to a planar substrate, in such a manner that substrate and ram, in combination, form a microfluid capillary system which is composed of one or more capillaries and has at least one inlet and outlet,
(c) bringing a dispersion of nanotubes into contact with at least one inlet of the microfluid capillary system, so that, using capillary force, the dispersion of nanotubes spreads out through the microfluid capillary system, filling the one or more capillaries,
(d) drying the dispersion of nanotubes, and
(e) removing the ram.

DETAILED DESCRIPTION

Figure 1:
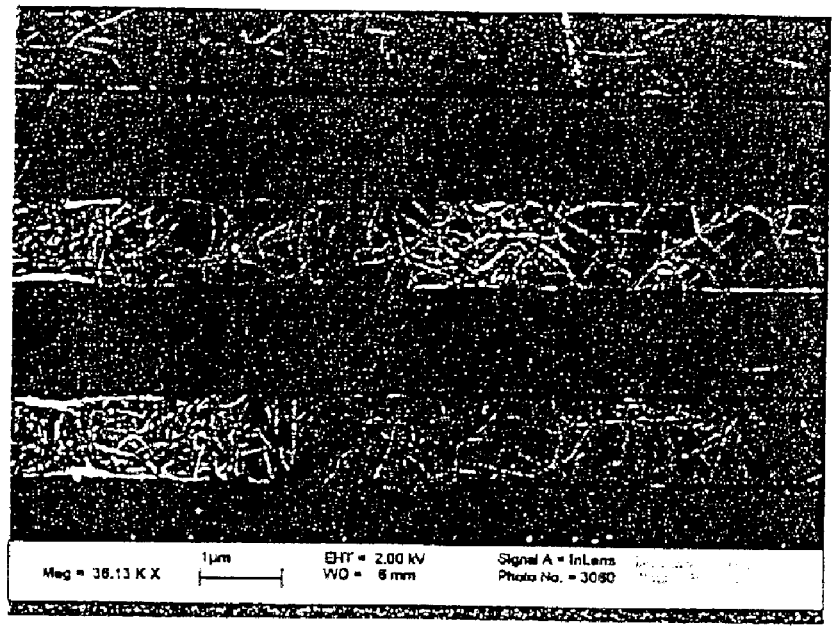
FIGS. 1 and 2 show scanning electron microscope images of carbon nanotubes applied to a Si wafer using the method of the present invention.

The deposition of the nanotubes in accordance with the invention is based on the use of capillaries in the (sub) micrometer or nanometer range. A ram which has a suitably structured surface and is made from elastomeric material, i.e. a ram with a relief structure, is brought into contact with a planar surface in order to produce microfluid networks or capillary systems of this type. When a drop of liquid of a nanotube dispersion is applied on one side, the liquid spreads out through the capillary system determined by the structure of the ram as a result of capillary forces. The mobility of the nanotubes in the capillaries is substantially determined by their size and by the shape of the individual capillaries. Moreover, the condition of the surfaces (morphology, hydrophilicity) influences the movement of the nanotubes.

In step (a) of the method according to the invention, first of all a ram made from elastomeric material having a relief structure on one of the ram surfaces is provided. A ram or casting mold or mask of this type made from elastomeric material having a relief structure on the surface, as used in the present invention, can be produced, for example, by replica molding by the liquid polymer precursor of an elastomer being cast over a master with a correspondingly predetermined surface relief structure, as is known from soft lithography; cf. for example Xia et al., Angewandte Chemie [Applied Chemistry], 1998, 110, pages 568 to 594. A structured ram which can be used in particular in the method according to the present invention may, for example, have structures with a width and height in the range from in each case 0.05 $\mu$m to 10.0 $\mu$m, preferably 0.3 $\mu$m to 10.0 $\mu$m, and a length in the range from 0.1 $\mu$m to 1.5 cm.

The elastomeric material of the ram is preferably selected from polydialkylsiloxanes, polyurethanes, polyimides and crosslinked Novolak resins. The elastomeric material of the ram is more preferably polydimethylsiloxane (PDMS). PDMS has a low surface energy and is chemically inert. Moreover, PDMS is homogenous, isotropic and optically transparent up to 300 nm.

In one embodiment of the present invention, in order to improve the spreading of the dispersion of nanotubes through the microfluid capillary system formed by substrate and patterned ram, the ram, before step (b) is carried out, may be subjected to hydrophilization, preferably by using an oxygen plasma.

The nanotubes used in the present invention may be of both single-walled and multi-walled configuration. In the case of multi-walled nanotubes, at least one inner nanotube is coaxially surrounded by an outer nanotube. The nanotubes which can be used in the method according to the invention are preferably carbon nanotubes, carbon nanotubes doped with boron nitride or oxidized carbon nanotubes. Carbon nanotubes are particularly preferred.

In step (c), the nanotubes are preferably dispersed in a polar organic solvent. Examples of such solvents which may be listed include dimethylformamide, acetonitrile, methylene chloride, chloroform, methanol and ethanol. Dimethylformamide is particularly suitable. Alternatively, the nanotubes may also be dispersed in water. The concentration of the nanotubes in dispersions of this type is usually 1 to 30 mg/l. In DMF, the concentration is, for example, $\leq 25$ mg/l.

The planar substrate on which the nanotubes are deposited in targeted structured form in accordance with the present invention is not subject to any specific restrictions. By way of example, the substrate may be selected from silicon, such as for example an Si wafer, gallium phosphide, indium phosphide, glass, aluminum oxide or silicon oxide.

Bringing the ram into contact with or applying the ram to the planar substrate produces a microfluid capillary system comprising one or more capillaries which is composed of the spaces between the ram recesses and the planar substrate surface. The one or more capillaries of the microfluid capillary system which are formed by the substrate and ram preferably have a width and height in the range from in each case 0.05 $\mu$m to 10.0 $\mu$m, preferably 0.3 $\mu$m to 10.0 $\mu$m, and a length in the range from 0.1 $\mu$m to 1.5 cm, as predetermined by the relief-like structuring or patterning of the ram surface. If a drop of liquid of the dispersion of nanotubes is applied to one side, it then flows into the spaces between the ram recesses and the planar substrate surface as a result of capillary action without pump systems having to be used to distribute the nanotube dispersion.

In one embodiment of the present invention, the nanotubes, before step (d) of the method according to the invention is carried out, can be oriented by the application of a magnetic field. Orientation of nanotubes in this way by using the influence of a magnetic field is known, for example, from Fujiwwara et al., J. Phys. Chem. A 105, 4383 (2001).

If the nanotubes are oxidized carbon nanotubes, before step (d) of the method according to the invention is carried out, they can also be oriented by the application of an electric voltage. Oxidized carbon nanotubes of this type are known, for example, from DE 100 38 124 A1. Oxidized carbon nanotubes of this type may have chemically charged groups, in particular carboxylate groups, at the outer wall. The carbon nanotubes provided with surface charges of this type are then attracted or repelled by the corresponding electrical potential, with a directional force acting on the carbon nanotubes.

After the dispersion has been deposited, the solvent is removed, for example by drying in a desiccator, if appropriate at increased temperature, and then the ram is removed. The nanotubes which have been arranged or applied in structured form remain in place on the planar surface.

In the context of the method according to the invention, it is also possible to build up a plurality of planes by repeating method steps (a) to (e). This can be achieved, for example, by, after the method steps (a) to (e) have been carried out for a first time, repeating this sequence of method steps one or more times, with the proviso that a ram with a differently patterned relief structure is then in each case used in step (a). Alternatively, this can be achieved by, after the method steps (a) to (e) have been carried out for a first time, repeating this sequence of method steps one or more times, with the proviso that the ram, in step (b), is then applied to the substrate which has already been structured by the deposition of the nanotubes in such a manner that the nanotubes are deposited in layers with in each case a different directional arrangement with respect to one another, preferably in layers with arrangements which cross one another.

The method according to the invention particularly advantageously allows the predetermined deposition of isolated nanotubes on planar surfaces without the need for any pump systems for distribution, since the method according to the invention is based on the use of capillary forces. Moreover, the method according to the invention allows subsequent orientation of the nanotubes and makes it possible to build up complex structures by repeating the corresponding sequence of method steps.

A further subject of the present invention relates to an electronic component comprising a substrate which, on at least one of its surfaces, has regularly arranged, discrete structures of nanotubes with a width in the range from 0.05 $\mu$m to 10.0 $\mu$m and a length in the range from 0.1 $\mu$m to 1.5 cm. In a preferred embodiment, the nanotubes are oriented substantially parallel to one another, based on the tube axis.

The present invention is explained in more detail by means of the following example.

Figure 2:
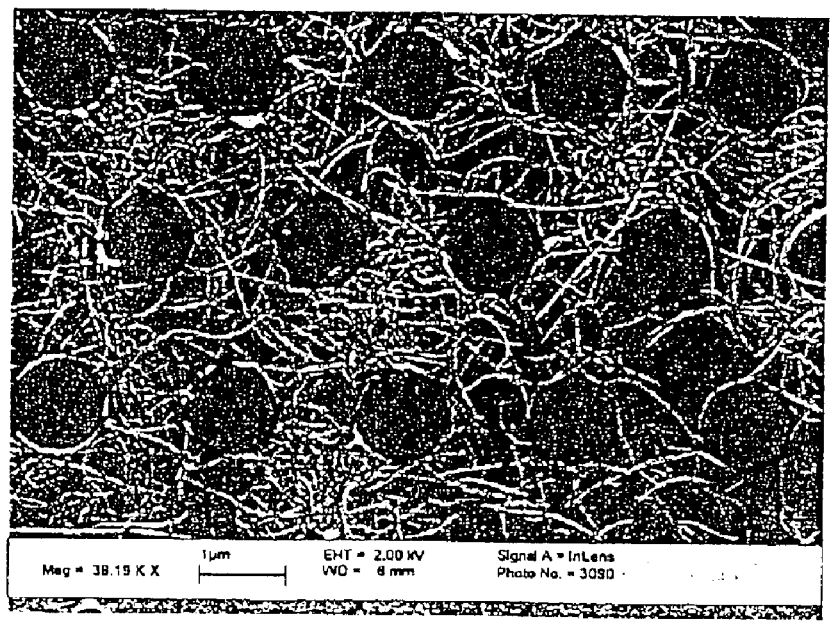

First of all, a ram was produced by filling a predetermined master with polydimethylsiloxane (PDMS). The PDMS on the structured surface of the master was cured by heating (1 hour at 60° C.). Then, the surface-structured PDMS ram was removed from the master without leaving any residues. To enable the drop of water or the nanotube dispersion to spread out through the capillaries, the PDMS was hydrophilized before making contact with the planar surface by using an oxygen plasma. When the structured PDMS ram is brought into contact with an Si wafer as planar substrate, a microfluid capillary system comprising one or more capillaries is formed, this system being composed of the spaces between ram recesses and the planar substrate surface (capillary width: 0.35 to 10.0 $\mu$m, capillary length: up to 1.5 cm). These passages or capillaries were filled up when a drop of a dispersion of carbon nanotubes in DMF was applied to one side. After the liquid had dried (12 hours in a desiccator), the structured PDMS ram was removed. The specimens produced were examined using scanning electron microscopy (SEM). FIGS. 1 and 2 show SEM images of carbon nanotubes applied to a Si wafer.

In an alternative variant, a DC voltage (2 V) was applied, in order to convey oxidized carbon nanotubes, which are provided with negative charges on account of the presence of carboxylate groups at the outer walls of the multi-walled nanotubes, to the anode. In this case, the passages or capillaries were firstly filled with distilled water and then a carbon nanotube dispersion in DMF of this type was injected.

We claim:

1. A method for the targeted deposition of a nanotube on a planar surfaces, the method comprising:
   providing a ram made from elastomeric material, the ram having a relief structure on a ram surface thereof;
   forming a microfluid capillary system by applying the ram to a planar substrate, the microfluid capillary system having at least one capillary having an inlet and an outlet;
   bringing a dispersion of nanotubes into contact with the inlet, thereby enabling capillary force to disperse the nanotubes through the microfluid capillary system;
   drying the resulting dispersion of nanotubes; and
   removing the ram.

2. The method of claim 1, further comprising selecting the nanotubes from the group consisting of carbon nanotubes, carbon nanotubes doped with boron nitride, and oxidized carbon nanotubes.

3. The method of claim 1, further comprising dispersing the nanotubes in a polar organic solvent.

4. The method of claim 1, further comprising selecting the substrate from the group consisting of silicon, gallium phosphide, indium phosphide, glass, and aluminum oxide.

5. The method of claim 1, further comprising selecting the elastomeric material from the group consisting of polydialkylsiloxane, polyurethane, polyimide, polydimethylsiloxane, and cross-linked Novolak resin.

6. The method of claim 1, further comprising subjecting the ram to hydrophilization prior to applying the ram to the planar substrate.

7. The method of claim 6, wherein subjecting the ram to hydrophilization comprises exposing the ram to oxygen plasma.

8. The method of claim 1, further comprising selecting a width and height of the capillary to be between 0.05 microns and 10 microns and selecting a length of the capillary to be between 0.1 microns and 1.5 centimeters.

9. The method of claim 8, further comprising selecting the width and height of the capillary to be between 0.3 microns and 10 microns.

10. The method of claim 1 further comprising orienting the nanotubes prior to drying the dispersion of nanotubes.

11. The method of claim 10, wherein orienting the nanotubes comprises exposing the nanotubes to an applied magnetic field.

12. The method of claim 10, further comprising selecting the nanotubes to be oxidized carbon nanotubes, and wherein orienting the oxidized carbon nanotubes comprises exposing the nanotubes to an applied electric field.

13. A method for targeted deposition of a nanotube on a planar surface, the method comprising:

executing the method recited in claim 1 using a ram having a first relief structure on a ram surface thereof;

re-executing the method recited in claim 1 using a ram having a second relief structure on a ram surface thereof, the second relief structure being different from the first relief structure.

14. A method for targeted deposition of a nanotube on a planar surface, the method comprising:

depositing a first layer of nanotubes by executing the method recited in claim 1, the first layer of nanotubes having a first orientation;

depositing a second layer of nanotubes by executing the method recited in claim 1 a second time with the ram applied to the substrate already structured during execution of the method recited in claim 1 the first time, the second layer of nanotubes having a second orientation that differs from the first orientation.

15. The method of claim 14, further comprising selecting the first and second orientations to be perpendicular to each other.

* * * * *